(12) United States Patent
Ono et al.

(10) Patent No.: US 10,074,308 B2
(45) Date of Patent: Sep. 11, 2018

(54) DISPLAY DEVICE AND METHOD FOR DRIVING SAME

(71) Applicant: JOLED INC., Tokyo (JP)

(72) Inventors: Shinya Ono, Osaka (JP); Shigeo Homura, Tokyo (JP)

(73) Assignee: JOLED INC., Tokyo (JP)

( * ) Notice: Subject to any disclaimer, the term of this patent is extended or adjusted under 35 U.S.C. 154(b) by 8 days.

(21) Appl. No.: 15/507,927

(22) PCT Filed: Aug. 27, 2015

(86) PCT No.: PCT/JP2015/004319
§ 371 (c)(1),
(2) Date: Mar. 1, 2017

(87) PCT Pub. No.: WO2016/035295
PCT Pub. Date: Mar. 10, 2016

(65) Prior Publication Data
US 2017/0294160 A1 Oct. 12, 2017

(30) Foreign Application Priority Data

Sep. 4, 2014 (JP) ................................. 2014-180469

(51) Int. Cl.
*G09G 3/32* (2016.01)
*G09G 3/3233* (2016.01)
(Continued)

(52) U.S. Cl.
CPC ............. *G09G 3/3233* (2013.01); *G09G 3/20* (2013.01); *G09G 3/2074* (2013.01); *G09G 3/30* (2013.01);
(Continued)

(58) Field of Classification Search
CPC ....... G09G 2300/043; G09G 2330/025; G09G 3/2074; G09G 3/3233; G09G 3/20; G09G 3/30; G02F 1/136286
See application file for complete search history.

(56) References Cited

U.S. PATENT DOCUMENTS

2006/0022969 A1* 2/2006 Lee .................... G02F 1/136286
345/211
2007/0029929 A1 2/2007 Nakamura et al.
(Continued)

FOREIGN PATENT DOCUMENTS

JP 2007-073499 3/2007
JP 2011-027819 2/2011
(Continued)

OTHER PUBLICATIONS

International Search Report (ISR) in International Pat. Appl. No. PCT/JP2015/004319, dated Dec. 1, 2015.

*Primary Examiner* — Richard Hong
(74) *Attorney, Agent, or Firm* — Greenblum & Bernstein, P.L.C.

(57) ABSTRACT

Provided is a method for driving a display device including: a display unit having a sub-pixel having a first light emitting element (organic EL element) and a first driving transistor for supplying a first electric current corresponding to a first gray level signal, and a sub-pixel having a second light emitting element (organic EL element) and a second driving transistor for supplying a second electric current corresponding to a second gray level signal; and a power supply unit configured to apply a power supply voltage to each sub-pixel via an electric current path that is common to the sub-pixel and the sub-pixel. The driving method includes correcting the first gray level signal based on the first gray level signal and the second gray level signal so as to compensate for a
(Continued)

reduction in the first electric current caused by a voltage drop that occurs in the electric current path.

6 Claims, 9 Drawing Sheets

(51) Int. Cl.
    *G09G 3/20*           (2006.01)
    *G09G 3/30*           (2006.01)
    *H01L 51/50*          (2006.01)

(52) U.S. Cl.
    CPC . *G09G 2300/043* (2013.01); *G09G 2330/025* (2013.01); *H01L 51/50* (2013.01)

(56) References Cited

U.S. PATENT DOCUMENTS

| | | |
|---|---|---|
| 2010/0020065 A1 | 1/2010 | Takasugi |
| 2011/0018787 A1 | 1/2011 | Nakamura et al. |
| 2014/0062989 A1 | 3/2014 | Ebisuno et al. |

FOREIGN PATENT DOCUMENTS

| | | |
|---|---|---|
| WO | 2008/093519 | 8/2008 |
| WO | 2013/094104 | 6/2013 |

* cited by examiner

DISPLAY DEVICE AND METHOD FOR DRIVING SAME

TECHNICAL FIELD

The present disclosure relates to a display device and a method for driving the same, and in particular to a display device that uses a current-driven light emitting element and a method for driving the same.

BACKGROUND ART

In recent years, attention has been paid to a display device such as an active matrix display that uses an organic electroluminescent element (hereinafter referred to as "organic EL element") that is self-emissive and has a wide viewing angle and high-speed responsiveness.

The display device includes: a display panel in which an organic EL element is disposed; and a drive circuit that drives the organic EL element. The display panel is configured by disposing organic EL elements in a matrix on a substrate made of glass or the like, each organic EL element including a first electrode made of Al or the like, a second electrode that is disposed oppositely to the first electrode, the second electrode being made of ITO (Indium Tin Oxide) and a metal thin film made of magnesium, aluminum, silver or the like, and a light emitting layer provided between the first electrode and the second electrode. The drive circuit is provided between the substrate and the first electrode, and is formed by using a thin film transistor (TFT) that drives an organic EL element, or the like.

Also, study has been conducted on a bottom emission type display device that provides light emitted by the organic EL elements to the outside via the substrate and a top emission type display device that provides light emitted by the organic EL elements from the second electrode side that is disposed oppositely to the substrate. However, in the bottom emission type active matrix display device, the thin film transistor of the drive circuit is formed on the substrate, and it is therefore difficult to ensure a sufficient aperture ratio.

On the other hand, in the top emission type display device, the aperture ratio is not limited by the thin film transistor or the like, and thus the efficiency of utilization of emitted light can be enhanced as compared to the bottom emission type display device. In this case, the top emission type display device provides the light to the outside via the second electrode formed on top of the light emitting layer, and thus the second electrode is required to have a high level of conductivity and a high level of light transmittance. However, in general, a metal oxide such as ITO or a thin film made of a metal such as magnesium, aluminum or silver is used as the transparent conductive material of the second electrode. Metal oxides and thin film metals have a higher resistivity than a metal layer used as a wire or the like. For this reason, a difference occurs in the wire length of the second electrode between light emitting pixels as the display panel is configured to the larger in area, which causes a large voltage drop between the end of the power supply unit and the center of the panel and creating a difference in brightness level accordingly, and as a result, the center appears dark. That is, there is a problem in that the brightness level varies depending on the position of the organic EL element on the display panel surface, which causes a deterioration in the quality of display.

In order to avoid this, it is effective to provide, for each pixel, a structure that feeds power from the low resistance wire provided at bottom to the transparent electrode provided on top.

In a display device disclosed in Patent Literature (PTL) 1, a first electrode made of a conductive material having a low resistivity and an auxiliary wire are provided separately on a substrate, a light modulation layer serving as a light emitting layer is provided on the first electrode, and a second electrode made of a transparent conductive material is provided on the light modulation layer. Furthermore, the auxiliary wire and the second electrode are connected via a buffer layer provided on the auxiliary wire.

CITATION LIST

Patent Literature

[PTL 1] Japanese Unexamined Patent Application Publication No. 2007-73499

SUMMARY OF INVENTION

Technical Problem

However, in the display device disclosed in PTL 1, the auxiliary wire and the second electrode are connected via the buffer layer having a relatively high resistance, and thus a relatively large voltage drop occurs between the second electrode and the auxiliary wire. Then, due to the voltage drop, the source potential or the drain potential in a driving transistor for supplying an electric current to the organic EL element varies. As a result, in the driving transistor, bootstrapping occurs in which the gate potential varies. Here, in the case where an electric current path composed of the auxiliary wire and the second electrode is shared by a plurality of organic EL elements, the amount of the voltage drop is determined by a sum of electric currents that simultaneously flow through the plurality of organic EL elements. In other words, the amount of bootstrap in the driving transistor connected to an organic EL element during a period between the completion of writing data to the start of light-emission period receives the influence of electric current flowing through the other organic EL elements with which the electric current path composed of the auxiliary wire and the second electrode is shared, where the amount of bootstrap is defined as a voltage variation of the source electrode that varies according to the voltage applied between the gate and the source of the driving transistor. For this reason, in the display device disclosed in PTL 1, it is not possible to allow a desired electric current to flow through each organic EL element. For example, a consideration is given to the case in which the organic EL elements in the sub-pixels for displaying red, green and blue within one pixel in the display device share the electric current path composed of the auxiliary wire and the second electrode. In this case, due to bootstrapping described above, a desired electric current does not flow through each organic EL element, and the balance of colors displayed by the pixel may be different from a desired color balance. In other words, the color representation ability of the display device as a whole may be deteriorated.

The present disclosure has been made to solve the problem described above, and it is an object of the present disclosure to provide a display device in which the influence on the electric current flowing through the light emitting element of a pixel from the electric current flowing through the light emitting element of another pixel is reduced, and a method for driving the same.

Solution to Problem

In order to achieve the above object, a method for driving a display device according to one aspect of the present disclosure is a method for driving a display device including: a control circuit that outputs a first gray level signal and a second gray level signal; a display unit including a first pixel and a second pixel, the first pixel having a first light emitting element which is a current-driven light emitting element and a first driving transistor for supplying, to the first light emitting element, a first electric current corresponding to the first gray level signal, and the second pixel having a second light emitting element which is a current-driven light emitting element and a second driving transistor for supplying, to the second light emitting element, a second electric current corresponding to the second gray level signal; and a power supply unit configured to apply a power supply voltage to the first pixel and the second pixel via an electric current path that is common to the first pixel and the second pixel, the method including correcting the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively.

Advantageous Effects of Invention

With the display device according to the present disclosure, it is possible to provide a display device in which the influence on the electric current flowing through the light emitting element of a pixel from the electric current flowing through the light emitting element of another pixel is reduced, and a method for driving the same.

DESCRIPTION OF EMBODIMENTS

Figure 1:
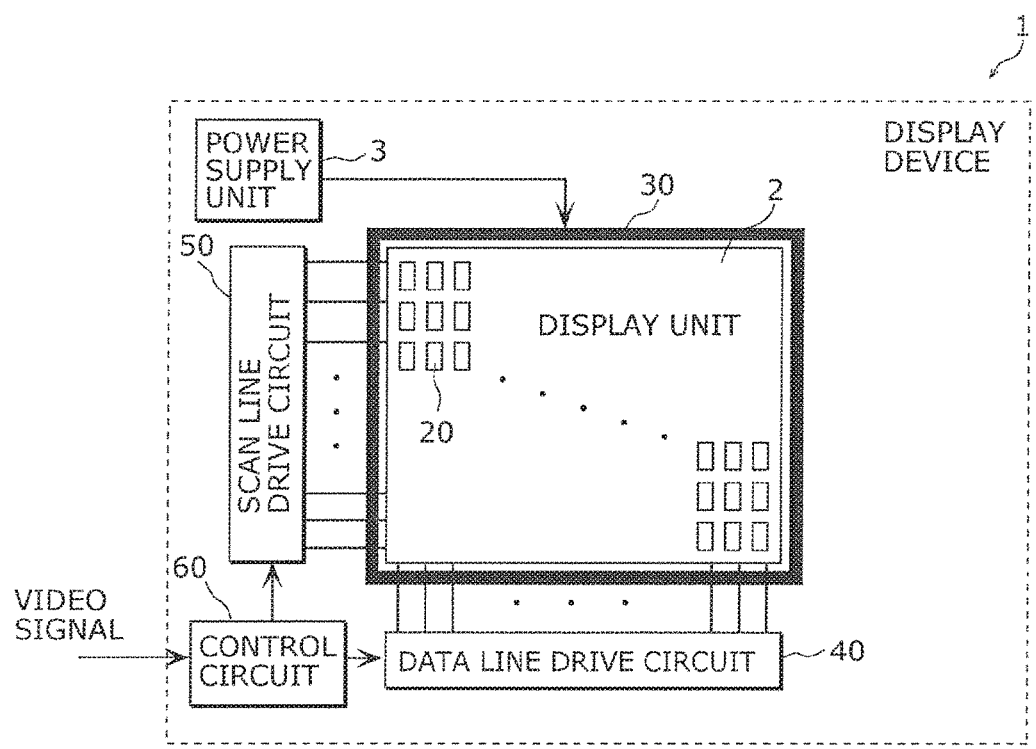
FIG. 1 is a functional diagram showing an overall configuration of a display device according to an embodiment.

Hereinafter, a display device according to one embodiment will be described with reference to the drawings. Note that the embodiments described below show preferred specific examples of the present disclosure. Accordingly, the numerical values, shapes, materials, structural elements, the arrangement and connection of the structural elements, steps, the order of the steps, and the like shown in the following embodiments are merely examples, and therefore are not intended to limit the scope of the present disclosure. Accordingly, among the structural elements described in the following embodiments, structural elements not recited in any one of the independent claims are described as arbitrary structural elements.

Note also that the diagrams are schematic representations, and thus are not necessarily true to scale. Also, in the diagrams, structural elements that are substantially the same are given the same reference numerals, and a redundant description is omitted or simplified.

Embodiment

A display device 1 according to an embodiment will be described with reference to the drawings.

FIG. 1 is a functional block diagram showing an overall configuration of the display device according to the present embodiment.

[Overall Configuration of Display Device]

The display device 1 according to the present embodiment includes a display unit 2, a power supply unit 3, a data line driving circuit 40, a scan line driving circuit 50, and a control circuit 60.

The display unit 2 is a display panel on which pixels 20 are arranged in a matrix, the pixels 20 each including an organic EL element and a circuit element for driving the organic EL element to emit light.

The power supply unit 3 feeds a power supply voltage to each pixel 20 through a power supply line 30 disposed in an outer peripheral region of the display unit 2. The power supply line 30 includes a positive voltage power supply line that transmits a positive power supply voltage and a negative voltage power supply line that transmits a negative power supply voltage that has a lower potential than the positive power supply voltage.

The control circuit 60 is an important part of the display device 1 according to the present embodiment. The control circuit 60 generates a gray level signal corresponding to the luminescence intensity of each organic. EL element based on an externally input video signal and outputs the generated gray level signal to the data line driving circuit 40. Also, the control circuit 60 generates a control signal S5 for controlling the scan line driving circuit 50 based on an input synchronization signal and outputs the generated control signal S5 to the scan line driving circuit 50. A detailed description of the control circuit 60 will be given later.

The data line driving circuit 40 drives a data line included in the display unit 2 based on the gray level signal generated by the control circuit 60. To be more specific, the data line driving circuit 40 outputs a data voltage to each pixel circuit based on the video signal and a horizontal synchronization signal, the data voltage being a voltage in which the video signal is reflected.

The scan line driving circuit 50 drives a scan line included in the display unit 2 based on the control signal S5 generated by the control circuit 60. To be more specific, the scan line driving circuit 50 outputs a scan signal and the like to each pixel circuit at least on a display line basis based on a vertical synchronization signal and the horizontal synchronization signal.

[Pixel Structure]

Figure 2:
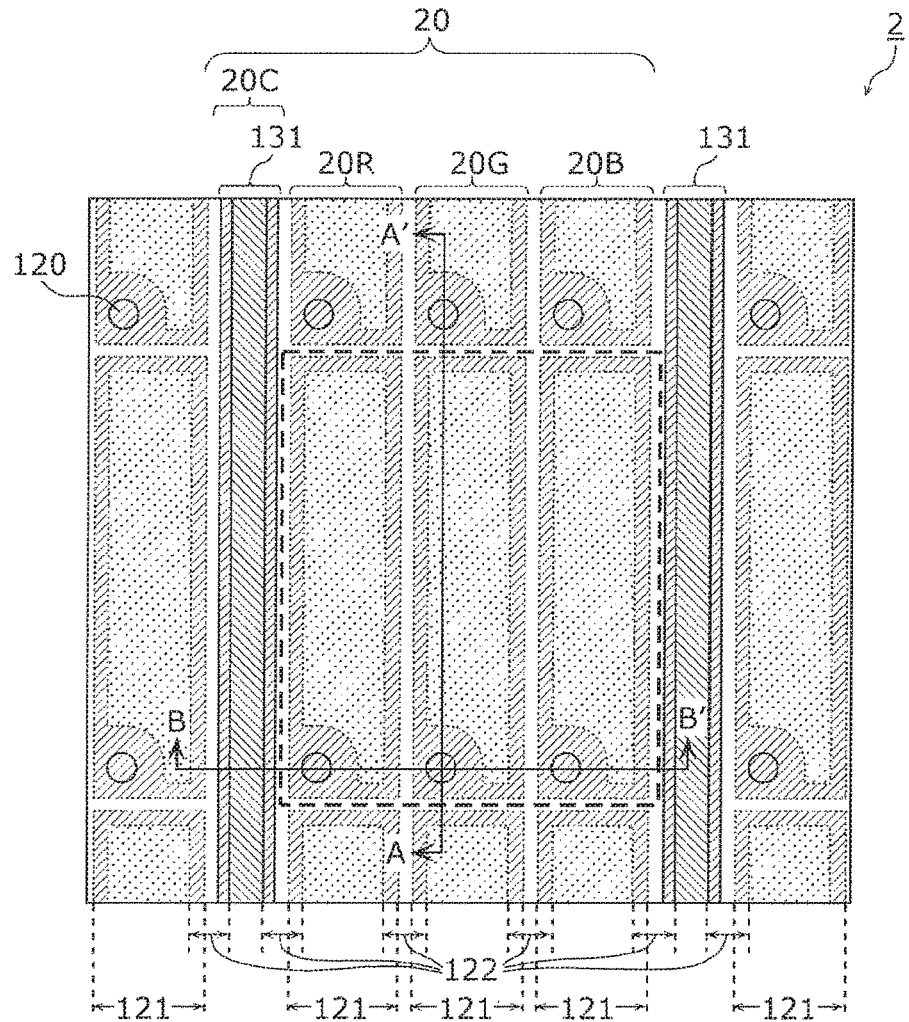
FIG. 2 is a partial plan view illustrating a display unit according to the embodiment.
Figure 3:
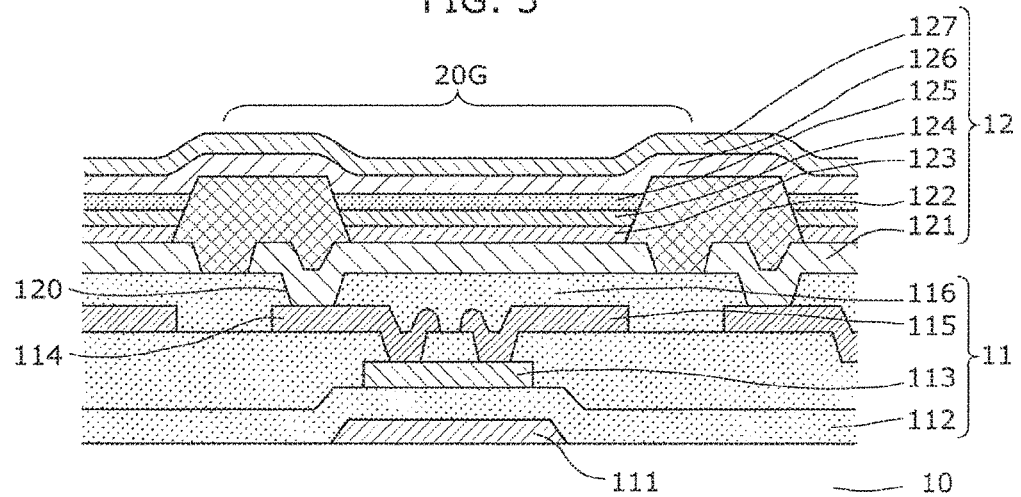
FIG. 3 is a cross-sectional view taken along the line A-A' shown in FIG. 2.
Figure 4:
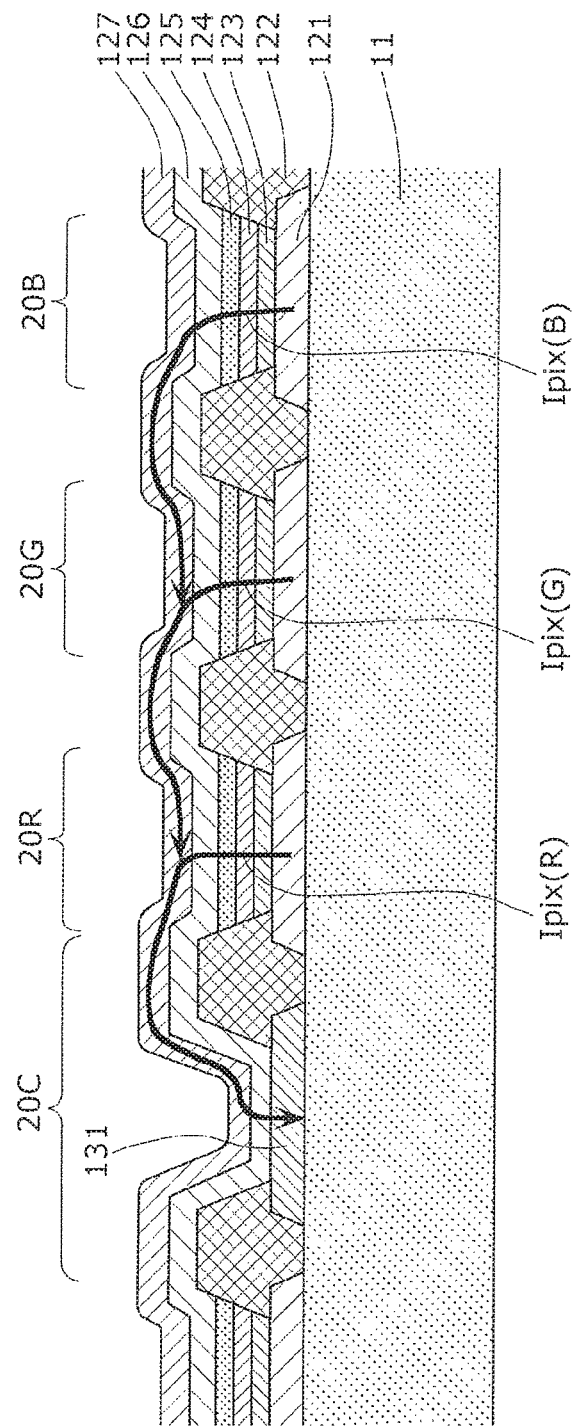
FIG. 4 is a cross-sectional view taken along the line B-B' shown in FIG. 2.

FIG. 2 is a partial plan view illustrating the display unit 2 according to the present embodiment. Also, FIG. 3 is a cross-sectional view taken along the line A-A' shown in FIG. 2, and FIG. 4 is a cross-sectional view taken along the line B-B' shown in FIG. 2. FIG. 2 shows a portion of the display unit 2 including one pixel 20. As shown in FIG. 2, the pixel 20 includes, for example, a sub-pixel 20R for displaying red, a sub-pixel 20G for displaying green, a sub-pixel 20B for displaying blue, and a connecting portion 20C. Also, FIG. 2 shows an anode 121 that is spacedly provided in each sub-pixel, a bank 122 that is provided for each sub-pixel column so as to define sub-pixels, an auxiliary wire 131 that is disposed for each pixel 20, and a via hole 120 that electrically connects a drive circuit layer and the anode 121.

Hereinafter, a stack structure of the pixel 20 will be described with reference to FIGS. 3 and 4. As shown in FIG. 3, the sub-pixel 20G includes a substrate 10, a drive circuit layer 11 provided on the substrate 10, and an organic EL layer 12 provided on the drive circuit layer 11.

The substrate 10 can be, for example, a glass substrate, a quartz substrate or the like. It is also possible to use a plastic substrate made of polyethylene terephthalate or polyethersulfone so as to impart bendability to the display device 1. In particular, in the case of a top emission type display device as in the present embodiment, a non-transparent plastic substrate or a ceramic substrate can be used.

The drive circuit layer 11 is a layer on which a circuit element for driving the organic EL element to emit light is formed. The circuit element can be, for example, a thin film transistor (hereinafter referred to as TFT). The drive circuit layer 11 includes, for example, a gate electrode 111, a gate insulating layer 112, a semiconductor layer 113, a source electrode 114, a drain electrode 115, an interlayer insulating layer 116, and a via hole 120.

The organic EL layer 12 includes an anode 121, a bank 122, a positive hole injection layer 123, a positive hole transport layer 124, an organic light emitting layer 125, an electron transport layer 126, and a transparent cathode 127.

The anode 121 is a first electrode that is formed on the interlayer insulating layer 116 and is spacedly formed in each sub-pixel. Also, the anode 121 is formed unitarily with the via hole 120 for connecting to the source electrode 114 in the driving transistor. There is no particular limitation on the material of the anode 121 and the via hole 120, and it is preferable to use a material having a small electrical resistivity. For example, it is possible to use: any one of the metals including silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, and cobalt; an alloy made using these metals; or a stack thereof.

The bank 122 is a partition wall that is provided for each sub-pixel column so as to define sub-pixels. The bank 122 can be made by using a resin material such as polyimide resin. At this time, in order to prevent the light generated by the organic light emitting layer 125 from being transmitted to adjacent sub-pixels, for example, carbon particles or the like may be incorporated into the resin.

The positive hole injection layer 123 is formed on the anode 121 and is spacedly formed in each sub-pixel by the bank 122. The positive hole injection layer 123 is a layer composed mainly of a positive hole injecting material. As used herein, the positive hole injecting material is a material that has a function of injecting positive holes injected from the anode 121 side into the organic light emitting layer 125 in a stable manner or while assisting in the generation of positive holes. As the positive hole injection layer 123, for example, PEDOT (polyethylenedioxythiophene) or the like can be used.

The positive hole transport layer 124 is formed on the positive hole injection layer 123 and is spacedly formed in each sub-pixel by the bank 122. The positive hole transport layer 124 has a function of transporting the positive holes injected from the positive hole injection layer 123 to the inside of the organic light emitting layer 125. As the positive hole transport layer 124, a positive hole transporting organic material can be used. As used herein, the positive hole transporting organic material is an organic substance that has a property of transmitting generated positive holes by an inter-molecular charge transfer reaction. This is also called a p-type organic semiconductor. The positive hole transport layer 124 may be made of a high molecular material or a low molecular material, but it is preferable that the positive hole transport layer 124 is formed by a wet printing method and contains a cross-linking agent such that it does not easily leach out into the organic light emitting layer 125 when forming the organic light emitting layer 125 that is an overlying layer. There is no particular limitation on the positive hole transporting material, and an aromatic amine can be used. Preferably, a triphenylamine derivative and a triarylamine derivative are used. As the cross-linking agent, for example, dipentaerythritol hexaacrylate and the like can be used.

There is no particular limitation on the method for forming the positive hole transport layer 124, and a nozzle jet method as typified by an inkjet method, or a dispenser method can be used. In this case, the inkjet method is a method for forming the positive hole transport layer 124 by spraying an ink made of an organic film-forming material from a nozzle.

The organic light emitting layer 125 is formed on the positive hole transport layer 124 and is spacedly formed in each sub-pixel by the bank 122. The organic light emitting layer 125 is a layer that emits light by application of voltage between the anode 121 and the transparent cathode 127. The organic light emitting layer 125 may be made of a low molecular organic light emitting material or a high molecular organic light emitting material. As the high molecular light emitting material, for example, a polymer light emitting material such as polyparaphenylenevinylene (PPV) or polyfluorene can be used. As the low molecular light emitting material, in addition to $Alq_3$ and Be-benzoquinolinol (BeBg2), it is also possible to use the following: benzoxazole fluorescent brightening agents such as 2,5-bis(5,7-di-t-pentyl-2-benzoxazolyl)-1,3,4-thiadiazole, 4,4'-bis(5,7-bentyl-2-benzoxazolyl)stilbene, 4,4'-bis[5,7-di-(2-methyl-2-butyl)-2-benzoxazolyl]stilbene, 2,5-bis(5,7-di-t-bentyl-2-benzoxazolyl)thiophine, 2,5-bis([5-α,α-dimethylbenzyl]-2-benzoxazolypthiophene, 2,5-bis[5,7-di-(2-methyl-2-butyl)-2-benzoxazolyl]-3,4-diphenylthio phene, 2,5-bis(5-methyl-2-benzoxazolyl)thiophene, 4,4'-bis(2-benzo oxazolyl) biphenyl, 5-methyl-2-[2-[4-(5-methyl-2-benzo oxazolyl) phenyl]vinyl]benzo oxazolyl and 2-[2-(4-chlorophenyl) vinyl]naphtho[1,2-d]oxazole; benzothiazole fluorescent brightening agents such as 2,2'-(p-phenylene divinylene)- bisbenzothiazole; benzo imidazole fluorescent brightening agents such as 2-[2-[4-(2-benzo imidazolyl)phenyl]vinyl] benzoimidazole and 2-[2-(4-carboxyphenyl)vinyl]benzo-imidazole; 8-hydroxyquinoline metal complexes such as tris(8-quinolinol)aluminum, bis(8-quinolinol)magnesium, bis(benzo[f]-8-quinolinol)zinc, bis(2-methyl-8-quinolino-lato)aluminum oxide, tris(8-quinolinol)indium, tris(5-methyl-8-quinolinol)aluminum, 8-quinolinol lithium, tris(5-chloro-8-quinolinol)gallium, bis(5-chloro-8-quinolinol) calcium and poly[zinc-bis(8-hydroxy 5-quinolinonyl) methane]; metal chelated oxinoid compounds such as dilithium epindolidione; styrylbenzene compounds such as 1,4-bis(2-methylstyryl)benzene, 1,4-(3-methylstyryl)ben-zene, 1,4-bis(4-methylstyryl)benzene, distyrylbenzene, 1,4-bis(2-ethylstyryl)benzene, 1,4-bis(3-ethylstyryl)benzene and 1,4-bis(2-methylstyryl)2-methylbenzene; distyrylpyra-zine derivatives such as 2,5-bis(4-methylstyryl)pyrazine, 2,5-bis(4-ethylstyryl)pyrazine, 2,5-bis[2-(1-naphthyl)vinyl] pyrazine, 2,5-bis(4-methoxystyryl)pyrazine, 2,5-bis[2-(4-bi-phenyl)vinyl]pyrazine and 2,5-bis[2-(1-pyrenyl)vinyl]pyra-zine; naphthalimide derivatives; perylene derivatives; oxadiazole derivatives; aldazine derivatives; cyclopentadi-ene derivatives; styrylamine derivatives; coumalin deriva-tives; aromatic dimethylidene derivatives; and the like. Furthermore, anthracene, salicylate, pyrene, coronene and the like can also be used. Alternatively, it is also possible to use a phosphorescent emitter material such as fac-tris(2-phenylpyridine)iridium.

The electron transport layer 126 is an intermediate layer that is composed mainly of an electron transporting material, the electron transport layer being formed on the organic light emitting layer 125 so as to overlie the bank 122 and extend to above the auxiliary wire 131, which will be described later with reference to FIG. 4. The electron transporting material is a material having both a property of being easily converted to anions as having electron acceptor properties and a property of transmitting generated electrons by an inter-molecular charge transfer reaction, and the electron transporting material being appropriate for transport of charges from the transparent cathode 127 to the organic light emitting layer 125. As the electron transport layer 126, for example, a polymer material made of an oxadiazole deriva-tive such as 1,3-bis(4-tert-butylphenyl-1,3,4-oxadiazolyl) phenylene(OXD-7), an anthraquinodimethane derivative, a diphenylquinone derivative or a silole derivative, or bis(2-methyl-8-quinolinolate)-(para-phenylphenolate)aluminum (BAlq), bathocuproine (BCP), or the like can be used.

The electron transport layer 126 that extends to above the auxiliary wire 131 and the electron transport layer 126 that is provided on the anode 121 do not need to be continuous. The electron transport layer 126 that is not continuous can be, for example, an electron transport layer 126 that can form a light emitting portion and a connecting portion in an isolated manner in the same film forming process without the use of a continuous highly accurate mask, and for example, the light emitting portion and the connecting portion are formed in an isolated manner by the bank 122 at the time of film formation by coating.

The transparent cathode 127 is a second electrode that is formed on the electron transport layer 126 so as to overlie the bank 122 and extend to above the auxiliary wire 131, which will be described later with reference to FIG. 4, the transparent cathode being formed entirely so as to cover all pixels 20 and being a transparent electrode that is provided continuously over the pixels 20. There is no particular limitation on the transparent cathode 127, but in the case of a top emission type display device, it is preferable to use a thin film made of a metal such as indium tin oxide, iridium zinc oxide, magnesium, aluminum or silver.

An electron injection layer may be formed between the electron transport layer 126 and the transparent cathode 127. Here, the electron injection layer is a layer composed mainly of an electron injecting material. As used herein, the electron injecting material is a material that has a function of inject-ing electrons injected from the transparent cathode 127 into the organic light emitting layer 125 in a stable manner or while assisting in the generation of electrons.

With the configuration described above, the display unit 2 emits, from the transparent cathode 127 side, light generated by recombination of the electrons and the positive holes injected into the organic light emitting layer 125.

Also, as shown in FIG. 4, the pixel 20 includes the connecting portion 20C that is a region that is adjacent to the sub-pixel 20R and in which the auxiliary wire 131 is disposed between the sub-pixel 20R and a sub-pixel included in another pixel 20. The auxiliary wire 131 is formed on the drive circuit layer 11 so as to be spaced apart from the anode 121. On the auxiliary wire 131, the electron transport layer 126 and the transparent cathode 127 that extend from above the anode 121 are formed.

That is, in the display unit 2 according to the present embodiment, the anode 121 and the organic light emitting layer 125 are spacedly provided in each sub-pixel, and the auxiliary wire 131 is disposed for each pixel column. With this configuration, the wire resistance that is dependent on the distance from the power feeding line 30 is reduced to suppress variations in the pixel drive voltage.

The auxiliary wire 131 may be disposed for each pixel row, rather than for each pixel column. Alternatively, the auxiliary wire 131 may be disposed both for each pixel column and for each pixel row.

With the stack structure of the auxiliary wire 131, the electron transport layer 126 and the transparent cathode 127 shown in FIG. 4, pixel currents $I_{pix}(R)$, $I_{pix}(G)$ and $I_{pix}(B)$ flowing from the driving transistor of the drive circuit layer 11 to the transparent cathode 127 via the anode 121, the positive hole injection layer 123, the positive hole transport layer 124, the organic light emitting layer 125 and the electron transport layer 126 further flow into the electron transport layer 126, which is provided on the auxiliary wire 131, and the auxiliary wire 131. A voltage drop correspond-ing to the sum $I_{pix}$ of the pixel currents $I_{pix}(R)$, $I_{pix}(G)$ and $I_{pix}(B)$ shown in FIG. 4 occurs in the connecting portion 20C between the transparent cathode 127 and the auxiliary wire 131.

There is no particular limitation on the auxiliary wire 131, but it is preferable to use the same material as that of the anode 121 because the auxiliary wire 131 can be formed in the same process as the anode 121 is formed.

The intermediate layer sandwiched between the auxiliary wire 131 and the transparent cathode 127 shown in FIG. 4 is not limited to the electron transport layer 126. The intermediate layer provided between the auxiliary wire 131 and the transparent cathode 127 may be configured to include at least one of the positive hole injection layer 123, the positive hole transport layer 124, the organic light emitting layer 125, the electron transport layer 126 and the electron injection layer (not shown in the diagram). How-ever, in this case, the intermediate layer is required to have a layer configuration that does not block a flow of the pixel current in a direction in which the pixel current flows.

[Configuration of Pixel Circuit]

Figure 5:
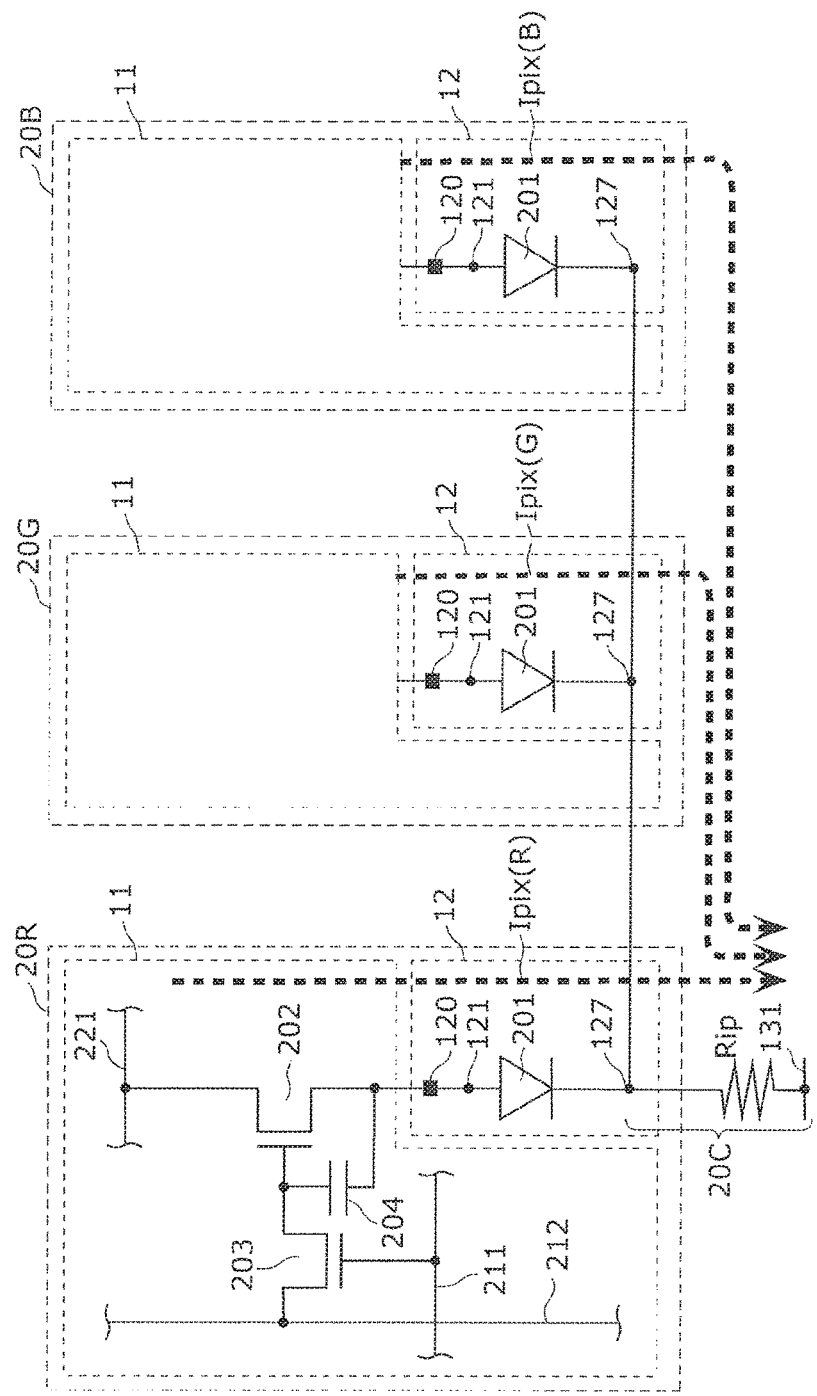
FIG. 5 is a diagram showing an example of a pixel circuit configuration according to the embodiment.

FIG. 5 is a diagram showing an example of a pixel circuit configuration according to the present embodiment. The sub-pixel 20R shown in the diagram includes the drive circuit layer 11 and the organic EL layer 12. The drive circuit layer 11 includes a data line 212, a scan line 211, a positive power supply wire 221, a switching transistor 203, a driving transistor 202, and a storage capacitor element 204. Also, the organic EL layer 12 includes an organic EL element 201. The sub-pixels 20G and 20B shown in FIG. 5 also have the same circuit configuration as that of the sub-pixel 20R, but the illustration of the circuit configuration of the drive circuit layers 11 of the sub-pixels 20G and 20B is omitted in FIG. 5. Pixels 20 each including the sub-pixel 20R, the sub-pixel 20G and the sub-pixel 20B are arranged in a matrix in the display unit 2.

The switching transistor 203 is, for example, an n-type TFT in which one of the source and the drain is connected to the data line 212, and the other one of the source and the drain is connected to the gate of the driving transistor 202 and one end of the storage capacitor element 204.

The driving transistor 202 is, for example, an n-type TFT in which the drain is connected to the positive power supply wire 221, the source is connected to the anode of the organic EL element 201, and the gate is connected to one end of the storage capacitor element 204. With this configuration, the driving transistor 202 supplies an electric current corresponding to the voltage stored in the storage capacitor element 204 to the organic EL element 201. In other words, the driving transistor 202 supplies an electric current corresponding to the gray level signal (and data voltage) to the organic EL element 201.

The other end of the storage capacitor element 204 is connected to the source of the driving transistor 202, and stores a voltage corresponding to the data voltage supplied from the data line 212.

The data line 212 connects the data line driving circuit 40 (not shown) and one of the source and the drain of the switching transistor 203, and a data voltage corresponding to the video signal is applied by the data line driving circuit 40.

The scan line 211 connects the scan line driving circuit 50 and the gate of the switching transistor 203, and the switching transistor 203 is conducted or non-conducted according to the voltage applied by the scan line driving circuit 50.

The organic EL element 201 is a light emitting element formed in the above-described organic EL layer 12. The anode (the anode 121) of the organic EL element 201 is connected to the source of the driving transistor 202 through the via hole 120, and the cathode (the transparent cathode 127) is connected to the auxiliary wire 131 through the intermediate layer (the electron transport layer 126). With this connection configuration, the organic EL element 201 emits light at a brightness level corresponding to the current value of the electric current flowing through the anode and the cathode. Here, the transparent cathode 127, which is the cathode electrode of the organic EL element 201, is commonly provided in each of all pixels 20 and electrically connected to the power supply unit 3 via the power supply line 30 such that a negative power supply voltage VEL is applied from the power supply line 30 provided in the outer peripheral region of the display unit 2.

The power supply voltage supplied by the power supply unit 3 includes a positive power supply voltage VDD supplied to the drain of the driving transistor 202 and the negative power supply voltage VEL supplied to the cathode of the organic EL element 201. The anode 121 and the positive power supply wire 221 connected to the drain of the driving transistor 202 receive a supply of the positive power supply voltage VDD from the power supply unit 3 via the power supply line 30 (positive voltage power supply line). On the other hand, the transparent cathode 127, which is the cathode of the organic EL element 201, receives a supply of the negative power supply voltage VEL from the power supply unit 3 via the auxiliary wire 131 and the power supply line 30 (negative voltage power supply line) constituting a common electric current path that is common to the sub-pixels included in the pixel 20. Although the power supply voltage supplied by the power supply unit 3 is defined as the positive power supply voltage VDD and the negative power supply voltage VEL, the positive power supply voltage VDD means a voltage having a potential higher than the negative power supply voltage VEL, and the negative power supply voltage VEL means a voltage having a potential lower than the positive power supply voltage VDD. That is, the positive power supply voltage VDD and the negative power supply voltage VEL are not limited to having a positive voltage value and a negative voltage value.

Here, with the pixel circuit configuration according to the present embodiment, a resistor $R_{ip}$ of the intermediate layer that is composed of the electron transport layer 126 is provided in series between the cathode of the organic EL element 201 and the auxiliary wire 131. As shown in FIG. 5, in each of the sub-pixels 20R, 20G and 20B, the pixel currents $I_{pix}(R)$, $I_{pix}(G)$ and $I_{pix}(B)$ flow from the driving transistor 202 of the drive circuit layer 11 to the common transparent cathode 127 through the anode 121 and the organic EL element 201. Furthermore, the pixel currents $I_{pix}(R)$, $I_{pix}(G)$ and $I_{pix}(B)$ flow into the resistor $R_{ip}$ and the auxiliary wire 131 constituting a common electric current path. Accordingly, the amount of voltage drop $V_{drop}$ that occurs between the transparent cathode 127 and the auxiliary wire 131 corresponds to the resistor $R_{ip}$ and the sum $I_{pix}$ of the pixel currents $I_{pix}(R)$, $I_{pix}(G)$ and $I_{pix}(B)$. The amount of bootstrap in the driving transistors 202 of the sub-pixels 20R, 20G and 20B varies as the amount of voltage drop $V_{drop}$ varies, and thus the amount of electric current flowing through each organic EL element 201 varies.

[Control Circuit]

Hereinafter, a configuration of the control circuit 60, which is an important part of the present embodiment, will be described. The control circuit 60 according to the present embodiment includes a configuration that corrects aray level signals in order to suppress variations in the amount of electric current flowing through each organic EL element 201 caused by variations in the amount of voltage drop $V_{drop}$ that occurs between the transparent cathode 127 and the auxiliary wire 131.

Figure 6:
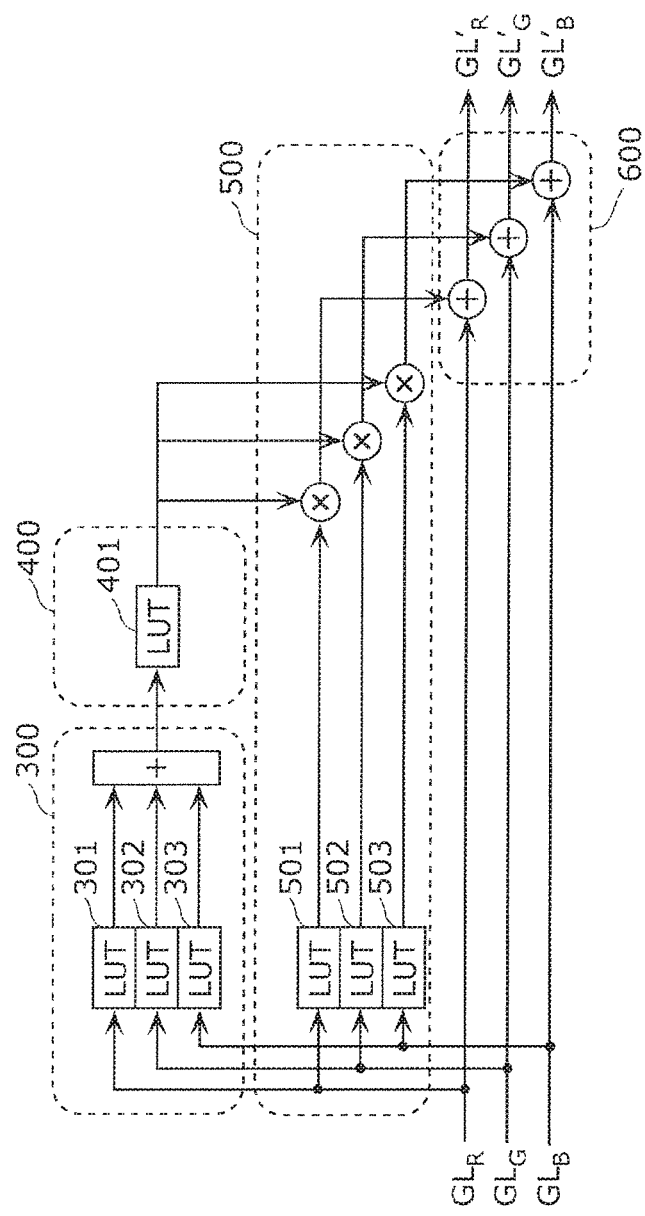
FIG. 6 is a block line diagram showing a computation method that corrects gray level signals in a control circuit according to the embodiment.

FIG. 6 is a block line diagram illustrating a computation method that corrects gray level signals in the control circuit 60 according to the present embodiment. FIG. 6 shows a computation method that corrects gray level signals $GL_R$, $GL_G$ and $GL_B$ corresponding to data voltages $V_{data}(R)$, $V_{data}(G)$ and $V_{data}(B)$ applied to the sub-pixels 20R, 20G and 20B included in one pixel 20.

As shown in FIG. 6, the control circuit 60 functionally includes a current computation unit 300, a voltage drop amount computation unit 400, a correction amount computation unit 500 and an adder unit 600.

The current computation unit 300 is a computation unit that computes the sum $I_{pix}$ of the pixel currents $I_{pix}(R)$, $I_{pix}(G)$ and $I_{pix}(B)$ flowing simultaneously through the sub-pixels corresponding to the gray level signals $GL_R$, $GL_G$ and $GL_B$. Here, with respect to each sub-pixel, a pixel current that flows through the sub-pixel upon application of a data voltage corresponding to the gray level signal when the amount of voltage drop $V_{drop}$ is zero is computed. In other words, a pixel current when the resistance from the transparent cathode 127 to the power supply line 30 is assumed to be zero is computed. In the current computation unit 300, the pixel currents $I_{pix}(R)$, $I_{pix}(G)$ and $I_{pix}(B)$ are obtained by using LUTs (Look-Up Tables) 301, 302 and 303 that show correspondence relationships between the gray level signal and the pixel current when the amount of voltage drop $V_{drop}$ is zero. Then, the sum $I_{pix}$ of the pixel currents is computed.

Here, a method for creating the LUT 301 for computing the pixel current flowing through the sub-pixel 20R when the amount of voltage drop $V_{drop}$ is zero will be described. First, relationships between the gray level signal $GL_R$, the data voltage $V_{data}(R)$ and the pixel current $I_{pix}(R)$ with respect to various amounts of voltage drop $V_{drop}$ are obtained through measurement. Then, relationships of the gray level signal $GL_R$, the data voltage $V_{data}(R)$ and the pixel current $I_{pix}(R)$ when the amount of voltage drop $V_{drop}$ is zero are inferred based on the obtained relationships. A LUT 301 showing correspondence relationships between the gray level signal and the pixel current when the amount of voltage drop $V_{drop}$ is zero is created based on the inferred relationships. The LUTs 302 and 303 are also created in the same manner as the LUT 301.

As the inferring method, a relationship of pixel current $I_{pix}$ with respect to data voltage $V_{data}$ when the amount of voltage drop $V_{drop}$ is zero may be obtained by simulating the operation of the pixel circuit.

Hereinafter, the computation performed by the current computation unit 300 will be described in detail. In the current computation unit 300, first, data voltages $V_{data}(R)$, $V_{data}(G)$ and $V_{data}(B)$ respectively corresponding to the gray level signals $GL_R$, $GL_G$ and $GL_B$ are obtained from the LUTs. They are represented by the following equations.

[Math. 1]

$$V\text{data}(R) = V_R(GL_R)$$

$$V\text{data}(G) = V_G(GL_G)$$

$$V\text{data}(B) = V_B(GL_B) \quad \text{(Equation 1)}$$

Here, $V_R(GL_R)$, $V_G(GL_G)$ and $V_B(GL_B)$ each represent a function for obtaining a data voltage corresponding to the gray level signal. These functions do not need to be stored in the LUTs. For example, only a table that shows the relationship between the gray level signal and the data voltage may be stored in each LUT. The same applies to the functions given below.

Then, next, in the current computation unit 300, the pixel current $I_{pix}(R)$ that flows when the data voltage is applied to the sub-pixel 20R is obtained from the LUT 301. The same applies to the sub-pixels 20G and 20B, and the pixel currents $I_{pix}(G)$ and $I_{pix}(B)$ respectively corresponding to the gray level signals $GL_G$ and $GL_B$ are obtained from the LUTs 302 and 303, respectively. They are represented by the following equations.

[Math. 2]

$$I\text{pix}(R) = I_R(V\text{data}(R))$$

$$I\text{pix}(G) = I_G(V\text{data}(G))$$

$$I\text{pix}(B) = I_B(V\text{data}(B)) \quad \text{(Equation 2)}$$

Here, $I_R(V_{data}(R))$, $I_G(V_{data}(G))$ and $I_B(V_{data}(B))$ each represent a function for obtaining a pixel current that flows when the amount of voltage drop $V_{drop}$ is zero and when the data voltage $V_{data}(R)$, $V_{data}(G)$ and $V_{data}(B)$ are respectively applied to the sub-pixels. In general they have a feature in that $I_{pix}$ increases as the video gray level signal GL increases. By adding the thus-obtained pixel currents $I_{pix}(R)$, $I_{pix}(G)$ and $I_{pix}(B)$ as indicated by the following equation, the sum $I_{pix}$ of pixel currents is obtained.

[Math. 3]

$$I\text{pix} = I\text{pix}(R) + I\text{pix}(G) + I\text{pix}(R) \quad \text{(Equation 3)}$$

The voltage drop amount computation unit 400 is a computation unit that computes the amount of voltage drop $V_{drop}$ that occurs between the transparent cathode 127 and the auxiliary wire 131 by using the sum $I_{pix}$ of pixel currents calculated by the current computation unit 300. In the voltage drop amount computation unit 400, the amount of voltage drop $V_{drop}$ is computed by using a LUT 401 that shows a relationship between the sum of pixel currents and the amount of voltage drop $V_{drop}$. The LUT 401 may be created by, as with the LUT 301 and the like described above, measuring properties in advance by using the display device or by inferring from the properties of a sample having the same structure by using a TEG or the like. Here, the relationship between the sum $I_{pix}$ of pixel currents and the amount of voltage drop $V_{drop}$ is represented by the following equation.

[Math. 4]

$$V\text{drop} = V(I\text{pix}) \quad \text{(Equation 4)}$$

Here, $V(I_{pix})$ represents a function for obtaining the amount of voltage drop $V_{drop}$ corresponding to the sum $I_{pix}$ of pixel currents. In general, it has a feature in that $V_{drop}$ increases as $I_{pix}$ increases.

The correction amount computation unit 500 is a computation unit that computes a correction amount for each data voltage. The correction amount is the amount of correction for compensating for a reduction in each pixel current due to a voltage drop that occurs between the transparent cathode 127 and the auxiliary wire 131. The correction amount computation unit 500 first convers each gray level signal to a data voltage. Then, the correction amount computation unit 500 obtains data voltage correction coefficients by using LUTs 501, 502 and 503 that show relationships between the data voltages $V_{data}(R)$, $V_{data}(G)$ and $V_{data}(B)$ and the data voltage correction coefficients corresponding to these data voltages. Here, the LUTs 501, 502 and 503 are parameters $\Delta V_{data}/\Delta V_{cat}$ obtained from the amount of adjustment $\Delta V_{data}$ of the data voltage required to keep the pixel current $I_{pix}$ constant when the cathode potential undergoes a unit voltage variation $\Delta V_{cat}$ (for example, 1 V) under various data voltage $V_{data}$ conditions, and the LUTs 501, 502 and 503 may be created in the same manner as the LUTs described above by measurement or by simulating the operation of the pixel circuit.

Next, the correction amount computation unit 500 multiplies the correction coefficients by the amount of voltage drop $V_{drop}$ obtained by the voltage drop amount computation unit 400. By doing so, correction amounts $V_{comp}(R)$, $V_{comp}(G)$ and $V_{comp}(B)$ respectively corresponding to the data voltages $V_{data}(R)$, $V_{data}(G)$ and $V_{data}(B)$ are obtained. The computation performed by the correction amount computation unit 500 is represented by the following equations.

[Math. 5]

$$V_{comp}(R) = \frac{\Delta Vdata(R)}{\Delta Vcat}\bigg|_{Vdata(R)} \cdot Vdrop$$

$$V_{comp}(G) = \frac{\Delta Vdata(G)}{\Delta Vcat}\bigg|_{Vdata(G)} \cdot Vdrop$$

$$V_{comp}(B) = \frac{\Delta Vdata(B)}{\Delta Vcat}\bigg|_{Vdata(B)} \cdot Vdrop \quad \text{(Equation 5)}$$

Here, $\Delta V_{cat}$ is the amount of change in the cathode potential and is a value corresponding to the amount of voltage drop $V_{drop}$. In Equation 5 given above, the coefficients with which the amount of voltage drop $V_{drop}$ is multiplied represent data voltage correction coefficients. In general, $V_{drop}$ increases as $I_{pix}$ increases, and because Equation 1 is a monotonically increasing function or a monotonically decreasing function, it has a feature in that $V_{comp}$ increases as GL increases.

The adder unit 600 is a computation unit that converts the data voltage correction amounts obtained by the correction amount computation unit 500 to gray level signal correction amounts, and adds the gray level signal correction amounts to pre-corrected gray level signals $GL_R$, $GL_G$ and $GL_B$. Corrected gray level signals that are computed by the adder unit 600 are represented by the following equations, where they are represented by $GL'_R$, $GL'_G$, and $GL'_B$.

[Math. 6]

$$GL'_R = GL_R + V_R^{-1}(Vcomp(R))$$

$$GL'_B = GL_B + V_B^{-1}(Vcomp(G))$$

$$GL'_B = GL_B + V_B^{-1}(Vcomp(B)) \quad \text{(Equation 6)}$$

As described above, the control circuit 60 according to the present embodiment corrects the gray level signals $GL_R$, $GL_G$ and $GL_B$ to $GL'_R$, $GL'_G$ and $GL'_B$. As a result of the corrected gray level signals being input into the data line driving circuit 40, a corrected data voltage is applied to each data line 212, and a pixel current corresponding to the corrected data voltage flows. Consequently, variations in the pixel currents $I_{pix}(R)$, $I_{pix}(G)$ and $I_{pix}(B)$ caused by variations in the amount of voltage drop $V_{drop}$ are suppressed.

[Examples of Measurement Result]

Next is a description of results of measurement of electric currents flowing through the sub-pixels when the gray level signal correction described above is applied.

Figure 7:
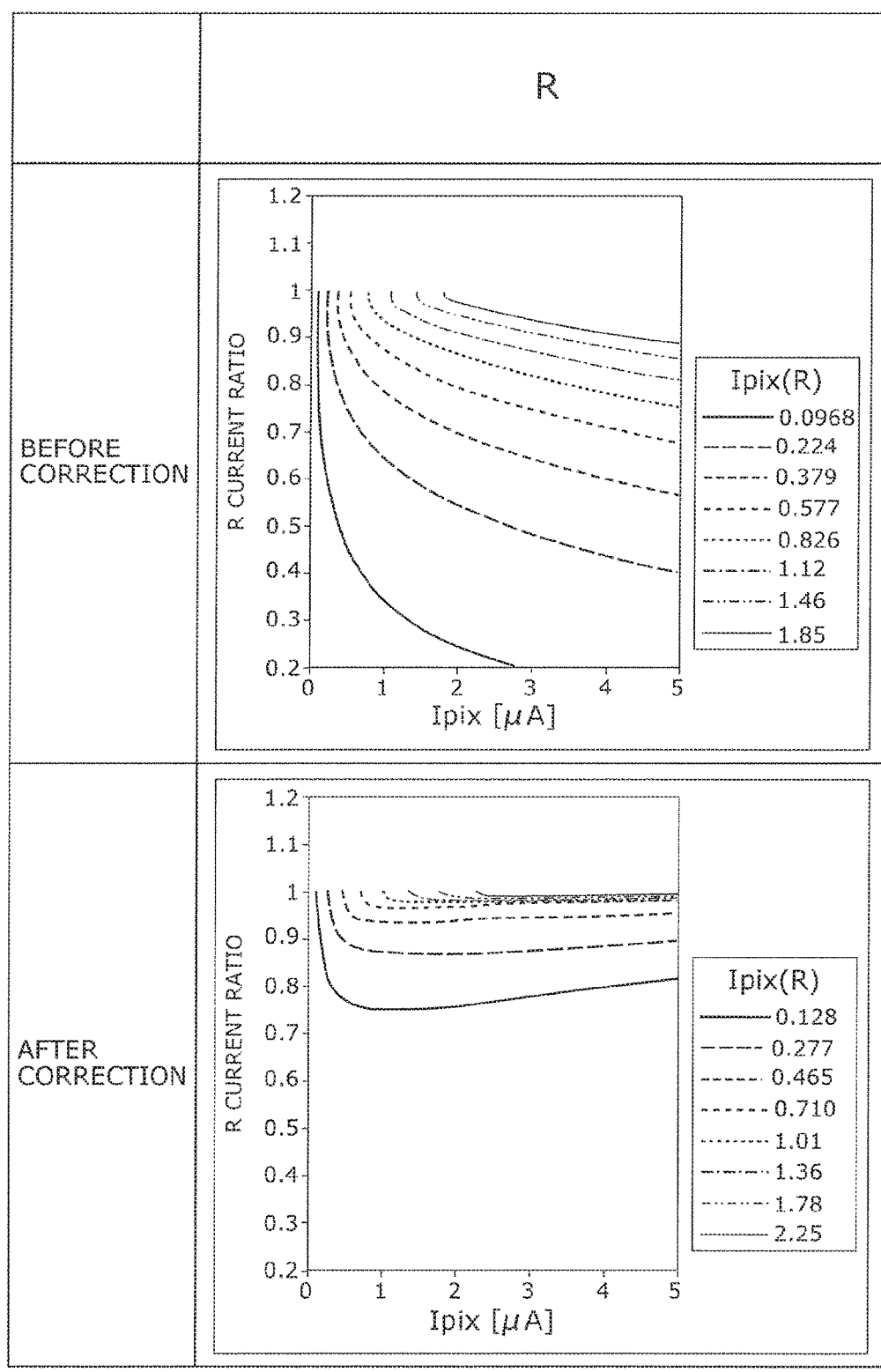
FIG. 7 is a graph showing a relationship between the sum $I_{pix}$ of pixel currents and R current ratio before and after a correction is applied to a gray level signal.
Figure 8:
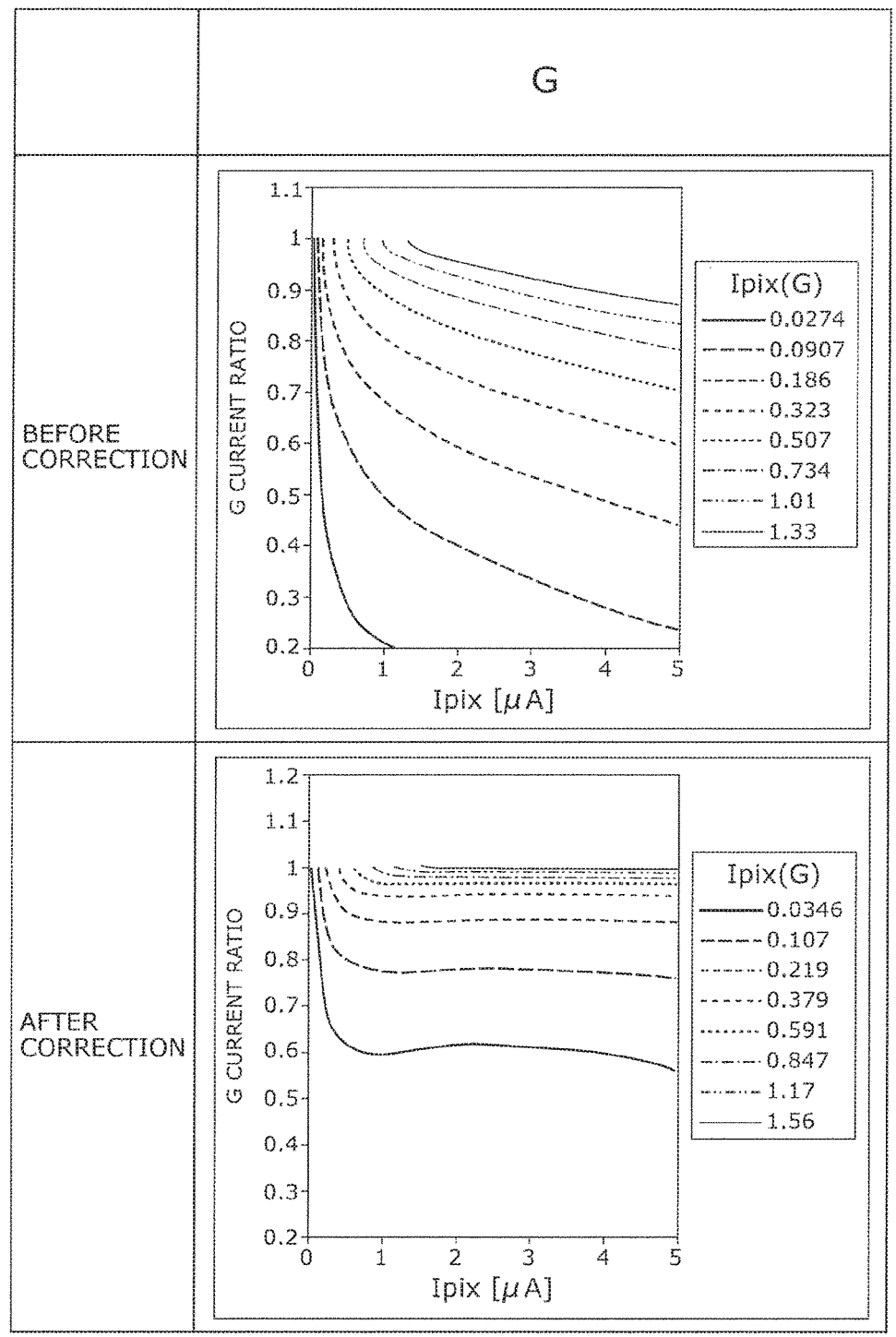
FIG. 8 is a graph showing a relationship between the sum of pixel currents and G current ratio before and after a correction is applied to a gray level signal.
Figure 9:
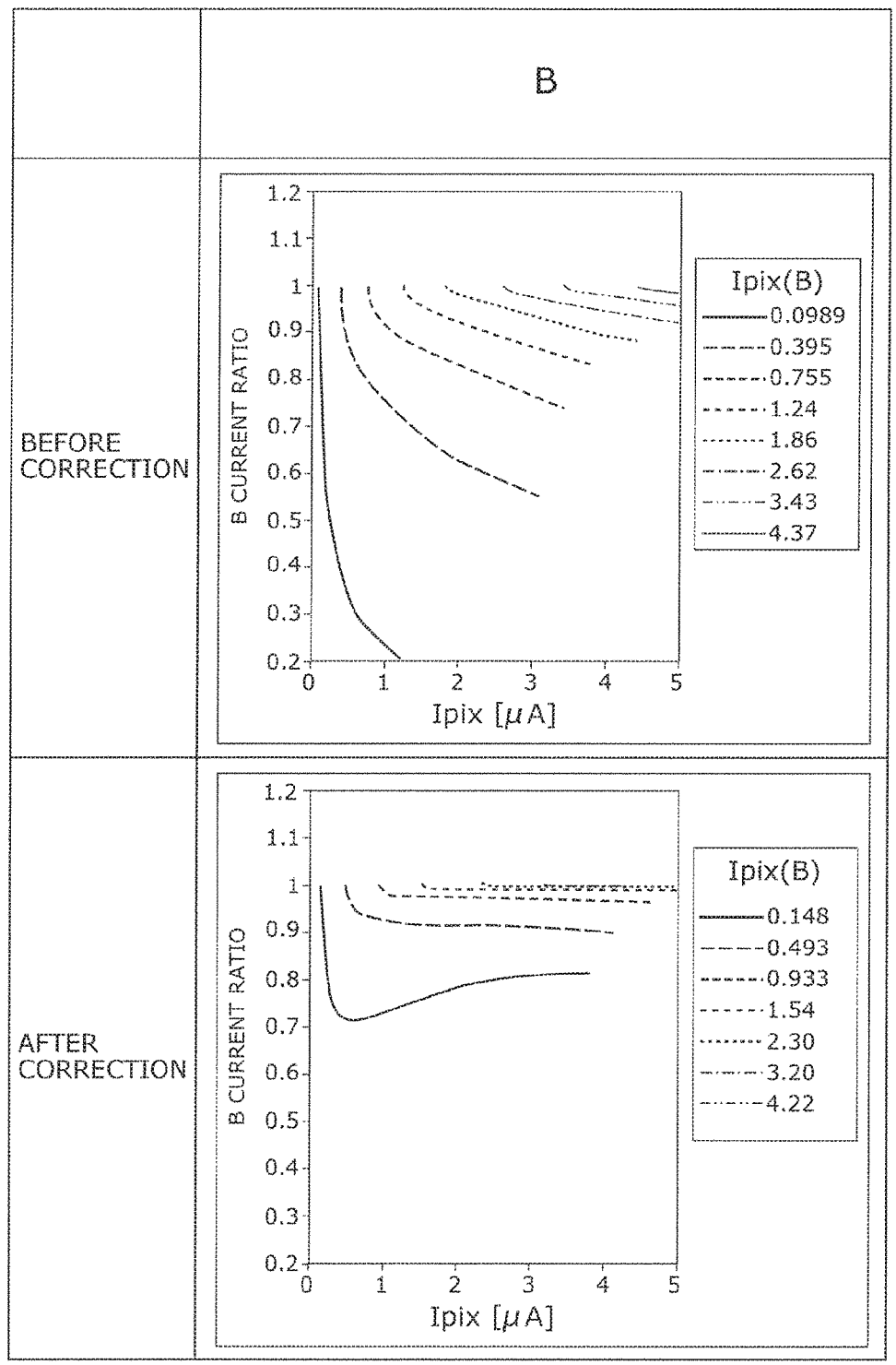
FIG. 9 is a graph showing a relationship between the sum $I_{pix}$ of pixel currents and B current ratio before and after a correction is applied to a gray level signal.

FIGS. 7 to 9 are graphs showing relationships between the sum $I_{pix}$ of the pixel currents $I_{pix}(R)$, $I_{pix}(G)$ and $I_{pix}(B)$ flowing through the organic EL elements 201 of the sub-pixels 20R, 20G and 20B and a current ratio ($I_{pix}(X)/(I_{pix}(R)+I_{pix}(G)+I_{pix}(B))$, X=R, G, B) before and after correction is applied to the gray level signals. R current ratio shown in FIG. 7 refers to the ratio of the electric current $I_{pix}(R)$ that flows through the organic EL element 201 of the sub-pixel 20R with a predetermined data voltage being applied to the sub-pixel 20R while the data voltage is also applied to the sub-pixels 20G and 20B with respect to the electric current $I_{pix}(R)$ when an electric current is allowed to flow only through the organic EL element 201 of the sub-pixel 20R with the predetermined data voltage being applied to the sub-pixel 20R. Ideally, the ratio is constantly 1 without being dependent on the sum $I_{pix}$ of pixel currents on the horizontal axis. The same applies to G current ratio shown in FIG. 8 and B current ratio shown in FIG. 9. Also, in FIGS. 7 to 9, an electric current flowing through the organic EL element 201 of each of the sub-pixels 20R, 20G and 20B being set as a parameter, and results of measurement with respect a plurality of parameters are shown. For example, the graph before application of correction shown in FIG. 7 shows results of measurement when $I_{pix}(R)$ is 0.0968 [µA], 0.224 [µA] and so on, $I_{pix}(R)$ being the pixel current that flows when an electric current is allowed to flow through only the organic EL element 201 of the sub-pixel 20R and no electric current is allowed to flow through the sub-pixels (20G and 20B) of the other colors ($I_{pix}(R)\neq 0$, $I_{pix}(G)=I_{pix}(B)=0$). That is, in this case, the current ratio with respect to the sum $I_{pix}$ of $I_{pix}(R)$ is 1. In the same way, FIG. 8 shows the results of measurement performed on $I_{pix}(G)$, and FIG. 9 shows the results of measurement performed on $I_{pix}(B)$.

As shown in FIG. 7, before application of correction, the current ratio decreases particularly when $I_{pix}$ is large and when $I_{pix}(R)$ is small. Similar tendencies are observed in FIGS. 8 and 9. On the other hand, from the graphs after application of correction shown in FIGS. 7 to 9, it can be seen that the reduction of the current ratio is suppressed with respect to the reduction of the current ratio before application of correction. In other words, the color representation ability of the display device 1 is improved.

To be specific, for example, as shown in the graph after application of correction shown in FIG. 7, in the case where the pixel current $I_{pix}(R)$ takes a value other than 0.128, R current ratio is 0.8 or more (in other words, 80% or more). That is, in the case where the gray level signal $GL_R$ has a gray level level that is at least a medium brightness level or more, R current ratio is 80% or more. Likewise, in FIGS. 8 and 9, in the case where the pixel currents $I_{pix}(G)$ and $I_{pix}(B)$ have a medium brightness level or more, G current ratio and B current ratio are 0.8 or more (in other words, 80% or more).

As described above, if each current ratio is maintained at 0.8 or more, or in other words, if the rate of reduction in the current ratio is maintained at less than 20%, it is possible to sufficiently suppress a situation in which the user becomes aware of a reduction in the pixel currents.

The results of measurement shown in FIGS. 7 to 9 are merely an example, and thus the current ratio after application of correction is applied may vary according to the LUT and the like used in the correction. For example, it is possible to create a LUT such that the current ratio after application of correction is 0.8 or more in all brightness regions (that is, the current ratio is 0.8 or more even in a low brightness region). By using such a LUT, it is possible to, in all brightness regions, sufficiently suppress a situation in which the user becomes aware of a reduction in the pixel currents.

Advantageous Effects, Etc.

As described above, an aspect of a method for driving a display device 1 according to the present embodiment is a method for driving a display device that includes: a control circuit 60 that outputs gray level signals $GL_R$, $GL_G$ and $GL_B$; a display unit 2 including a sub-pixel 20R having an organic EL element 201 and a driving transistor 202 for supplying, to the organic EL element 201, an electric current $I_{pix}(R)$ corresponding to the gray level signal $GL_R$, a sub-pixel 20G having an organic EL element 201 and a driving transistor 202 for supplying, to the organic EL element 201, an electric current $I_{pix}(G)$ corresponding to the gray level signal $GL_G$, and a sub-pixel 20S having an organic EL element 201 and a driving transistor 202 for supplying, to the organic EL element 201, an electric current $I_{pix}(B)$ corresponding to the gray level signal $GL_B$; and a power supply unit 3 that applies a power supply voltage to the sub-pixels 20R, 20G and 20B via an electric current path that is common to the sub-pixels 20R, 20G and 20B. The driving method includes a step of correcting the gray level signals $GL_R$, $GL_G$ and $GL_B$ based on the gray level signals $GL_R$, $GL_G$ and $GL_B$ so as to compensate for a reduction in currents $I_{pix}$ (R), $I_{pix}$(G) and $I_{pix}$(B) caused by a voltage drop that occurs in the common electric current path when the currents $I_{pix}$ (R), $I_{pix}$(G) and $I_{pix}$(B) are supplied simultaneously to the organic EL elements 201, respectively.

According to this method, the influence on the electric current flowing through the organic EL element 201 of a sub-pixel from the electric current flowing through the organic EL element 201 of another pixel is reduced. In other words, it is possible to allow a desired electric current corresponding to the gray level signal to flow through the organic EL element 201 of each sub-pixel. Accordingly, the deterioration of the color representation ability in the pixel 20 including the sub-pixels 20R; 20G and 20B caused by the above-described influence is reduced.

Also, the correction step described above may include a step of obtaining an amount of voltage drop $V_{drop}$ that occurs in a connecting portion 20C, which is the electric current path described above, based on the gray level signals $GL_R$, $GL_G$ and $GL_B$ and a step of obtaining an amount by which the gray level signal $GL_R$ is to be corrected, based on the amount of voltage drop $V_{drop}$.

With this configuration, the amount of voltage drop $V_{drop}$ that has an influence on the electric current flowing through the organic EL element 201 of the sub-pixel 20R is obtained, and the gray level signal $GL_R$ is corrected based on the amount of voltage drop $V_{drop}$. Accordingly, the gray level signal can be appropriately corrected.

Also, the organic EL elements 201 of the sub-pixels 20R, 20G and 20B share one transparent cathode 127, and the electric current path includes an auxiliary wire 131 that is electrically connected to the transparent cathode 127, and the amount of voltage drop $V_{drop}$ may be the amount of voltage drop that occurs in the connecting portion 20C between the transparent cathode 127 and the auxiliary wire 131.

With this configuration, particularly when the resistance in the connecting portion 20C is relatively large, a voltage drop in the connecting portion 20C becomes dominant. For this reason, by correcting the gray level signal $GL_R$ based on the amount of the voltage drop, the gray level signal can be appropriately corrected.

Also, in the correction step described above, the gray level signals $GL_R$, $GL_G$ and $GL_B$ may be corrected such that each of the electric currents $I_{pix}$ (R), $I_{pix}$(G) and $I_{pix}$ (B) when electric currents corresponding to the gray level signals $GL_R$, $GL_G$ and $GL_B$ are supplied simultaneously to the organic EL elements 201 of the sub-pixels 20R, 20G and 20B is 80% or more of the electric current (any one of $I_{pix}$ (R), $I_{pix}$ (G) and $I_{pix}$ (B)) when an electric current corresponding to any one of the gray level signals $GL_R$, $GL_G$ and $GL_B$ is supplied only to the organic EL element 201 of any one of the sub-pixels 20R, 20G and 20B.

It is thereby possible to sufficiently suppress a situation in which the user becomes aware of a reduction in the pixel currents.

Also, in the correction step described above, the gray level signals $GL_R$, $GL_G$ and $GL_B$ may be corrected such that each of the electric currents $I_{pix}$ (R), $I_{pix}$ (G) and $I_{pix}$ (B) when electric currents corresponding to the gray level signals $GL_R$, $GL_G$ and $GL_B$ are supplied simultaneously to the organic EL elements 201 of the sub-pixels 20R, 20G and 20B and each gray level signal has a gray level level that is a medium brightness level or more is 80% or more of the electric current (any one of $I_{pix}$ (R), $I_{pix}$ (G) and $I_{pix}$ (B)) when an electric current corresponding to any one of the gray level signals $GL_R$, $GL_G$ and $GL_B$ is supplied only to the organic EL element 201 of any one of the sub-pixels 20R, 20G and 20B.

By doing so, at least when the organic EL element has a medium brightness level or more, it is possible to sufficiently suppress a situation in which the user becomes aware of a reduction in the pixel currents.

Other Embodiments

Although the display device and the method for driving the same according to the present disclosure have been described above by way of an embodiment, the display device according to the present disclosure is not limited to the embodiment given above. The present disclosure also encompasses other embodiments implemented by any combination of the structural elements of the embodiment, variations obtained by making various modifications that can be conceived by a person having ordinary skill in the art to the embodiment without departing from the scope of the present disclosure, and various types of devices incorporating the display device according to the present embodiment.

For example, in the embodiment given above, an example has been shown in which the influence on the electric current flowing through the organic EL element 201 of each of the sub-pixels 20R, 20G and 20B included in the pixel 20 from the electric currents flowing through the organic EL element 201 of the other sub-pixels is suppressed, but the present disclosure is not limited thereto. The present disclosure can be applied when the influence on the electric current flowing through the organic EL element of a pixel in the display device from the electric current flowing through the organic EL element of a pixel or sub-pixel to which a power supply voltage is applied via an electric current path having a resistance component that is common to the pixel is suppressed.

Also, in the embodiment given above, an example has been described in which organic EL elements are used as light emitting elements, but other current-driven light emitting elements may be used.

Also, in the embodiment given above, an example has been shown in which the voltage drop occurs in the connecting portion 20C between the transparent cathode 127 and the auxiliary wire 131, but the voltage drop may occur in other electric current path portions. For example, the voltage drop may occur in a resistance component such as the power supply line.

Also, in the embodiment given above, an example has been described in which the organic EL layer 12 has a configuration of anode/positive hole injection layer/positive hole transport layer/organic light emitting layer/electron transport layer/cathode, but the configuration is not limited thereto. For example, the organic EL layer may include at least an organic light emitting layer, an anode and a cathode. Alternatively, for example, the organic EL layer may include, other than the organic light emitting layer, the anode and the cathode, at least one of a positive hole injection layer, a positive hole transport layer, an electron transport layer and an electron injection layer.

Also, in the embodiment given above, an example has been shown in which the electron transport layer 126 is formed between the transparent cathode 127 and the auxiliary wire 131, but the electron transport layer 126 does not need to be formed. For example, even when the surface of the auxiliary wire 131 is oxidized to increase the resistance to a high level, a voltage drop occurs between the transparent cathode 127 and the auxiliary wire 131.

Also, in the embodiment given above, a) figuration has been shown, as an example, that reduces the influence due to variations in the voltage drop (rise) in the negative power supply voltage $V_{EL}$ in the transparent cathode 127 formed continuously in the display unit 2. However, the configuration of the present disclosure is not limited thereto. Depending on the circuit configuration, the light emission scheme, the stack structure of the organic EL layer, and the like, the present disclosure also encompasses a configuration that reduces, for example, the influence due to variations in the voltage drop in the positive power supply voltage $V_{DD}$ by the anode 121 in a common anode top emission.

Also, in the embodiment given above, each pixel 20 includes three sub-pixels 20R, 20G and 20B, but the pixel configuration is not limited thereto. For example, even if each pixel 20 is composed of one pixel without including a plurality of sub-pixels, the present disclosure can be applied if a power supply voltage is applied to a plurality of pixels from the power supply unit 3 via a common electric current path.

Also, in the embodiment given above, a configuration has been shown in which an n-type TFT is used as the driving transistor 202, but a p-type TFT may be used, and other circuit configuration may be changed accordingly as appropriate.

Also, in the embodiment given above, LUTs are used to correct the gray level signals, but a configuration is possible in which correction functions or the like other than the LUTs are prepared in advance and the gray level signals are corrected by using the correction functions.

Also, in the embodiment given above, a configuration has been shown in which the gray level signals are corrected in the control circuit 60, but a configuration may be used in which the data voltages are corrected.

The embodiment given above has been described as the intermediate layer being a portion of a layer that constitutes a light emitting portion, but the intermediate layer that constitutes a connecting portion does not need to be continuous with the layer that constitutes a light emitting portion. The intermediate layer may be, for example, an intermediate layer that can form a light emitting portion and a connecting portion in an isolated manner without the use of a highly accurate mask and in which, for example, the light emitting portion and the connecting portion are formed in an isolated manner by the bank 122 at the time of film formation by coating.

Figure 10:
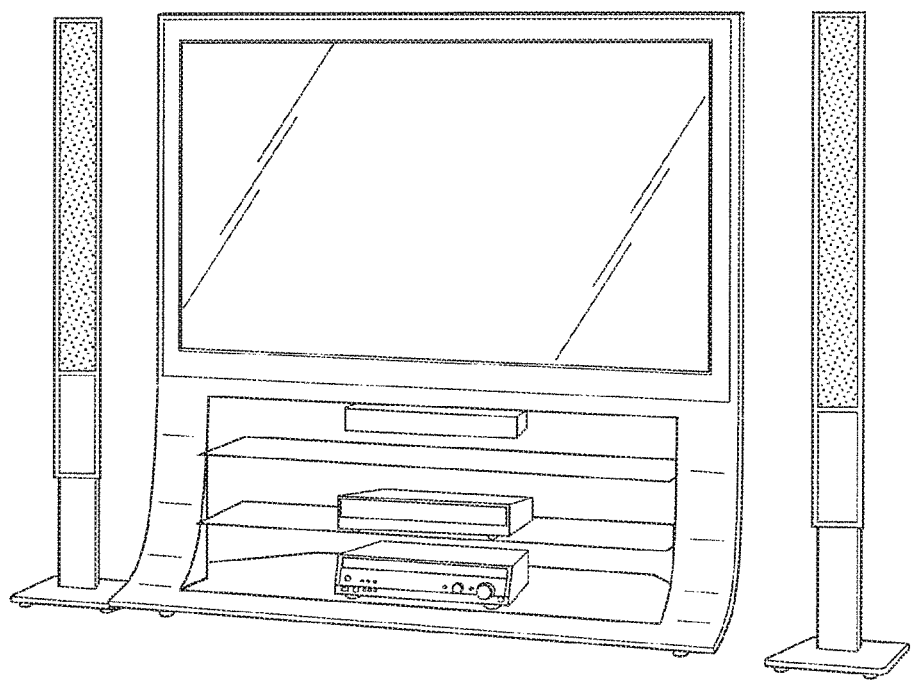
FIG. 10 is an external view of a thin flat-screen television set incorporating the display device according to the embodiment.

Also, for example, the display device 1 according to the present embodiment is incorporated in a thin flat-screen television set as shown in FIG. 10. With the display device 1 according to the present embodiment, a thin flat-screen television set having a high level of color representation ability is implemented.

INDUSTRIAL APPLICABILITY

The present disclosure is useful for an organic EL flat panel display, and is optimal for use as a display required to have a color representation ability.

The invention claimed is:
1. A method for driving a display device including:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
the method comprising
correcting the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively,
wherein a correction amount for the power supply voltage corresponding to a correction amount for the first gray level signal in the correcting of the first gray level signal is positively correlated with the first gray level signal.

2. A method for driving a display device including:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
the method comprising
correcting the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively,
wherein in the correcting, the first gray level signal is corrected such that the first electric current when electric currents corresponding to the first gray level signal and the second gray level signal are supplied simultaneously to the first light emitting element and the second light emitting element is 80% or more of the first electric current when an electric current corresponding to the first gray level signal is supplied only to the first light emitting element.

3. A method for driving a display device including:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
the method comprising
correcting the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively,
wherein in the correcting, the first gray level signal is corrected such that the first electric current when electric currents corresponding to the first gray level signal and the second gray level signal are supplied simultaneously to the first light emitting element and the second light emitting element, respectively, and the first gray level signal has a gray level level that is a medium brightness level or more is 80% or more of the first electric current when an electric current corresponding to the first gray level signal is supplied only to the first light emitting element.

4. A display device comprising:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
wherein the control circuit corrects the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively, and
wherein a correction amount for the power supply voltage corresponding to a correction amount for the first gray level signal is positively correlated with the first gray level signal.

5. A display device comprising:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
wherein the control circuit corrects the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively, and
wherein the control circuit corrects the first gray level signal such that the first electric current when electric currents corresponding to the first gray level signal and the second gray level signal are supplied simultaneously to the first light emitting element and the second light emitting element is 80% or more of the first electric current when an electric current corresponding to the first gray level signal is supplied only to the first light emitting element.

6. A display device comprising:
a control circuit that outputs a first gray level signal and a second gray level signal;
a display including a first pixel and a second pixel,
the first pixel having a first light emitting element which is a current-driven light emitting element and a first driving transistor for supplying, to the first light emitting element, a first electric current corresponding to the first gray level signal, and
the second pixel having a second light emitting element which is a current-driven light emitting element and a second driving transistor for supplying, to the second light emitting element, a second electric current corresponding to the second gray level signal; and
a power supply configured to apply a power supply voltage to the first pixel and the second pixel via an electric current path that is common to the first pixel and the second pixel,
wherein the control circuit corrects the first gray level signal based on the first gray level signal and the second gray level signal so as to compensate for a reduction in the first electric current caused by a voltage drop that occurs in the electric current path when the first electric current and the second electric current are supplied simultaneously to the first light emitting element and the second light emitting element, respectively, and wherein the control circuit corrects the first gray level signal such that the first electric current when electric currents corresponding to the first gray level signal and the second gray level signal are supplied simultaneously to the first light emitting element and the second light emitting element, respectively, and the first gray level signal has a gray level that is a medium brightness level or more is 80% or more of the first electric current when an electric current corresponding to the first gray level signal is supplied only to the first light emitting element.

* * * * *